(12) United States Patent
Loyd et al.

(10) Patent No.: US 11,099,214 B2
(45) Date of Patent: Aug. 24, 2021

(54) SENSORS WITH DISCRETE CAPACITORS FOR HIGH VOLTAGE SEPARABLE CONNECTORS

(71) Applicant: 3M INNOVATIVE PROPERTIES COMPANY, St. Paul, MN (US)

(72) Inventors: Jaylon D. Loyd, Austin, TX (US); Christopher R. Wilson, Austin, TX (US); Carl J. Wentzel, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 63 days.

(21) Appl. No.: 16/609,782

(22) PCT Filed: May 8, 2018

(86) PCT No.: PCT/IB2018/053207
§ 371 (c)(1),
(2) Date: Oct. 31, 2019

(87) PCT Pub. No.: WO2018/211358
PCT Pub. Date: Nov. 22, 2018

(65) Prior Publication Data
US 2020/0064376 A1    Feb. 27, 2020

Related U.S. Application Data

(60) Provisional application No. 62/507,466, filed on May 17, 2017.

(51) Int. Cl.
*G01R 15/06* (2006.01)
(52) U.S. Cl.
CPC ................... *G01R 15/06* (2013.01)

(58) Field of Classification Search
CPC ............................. G01R 15/06; G01R 15/16
See application file for complete search history.

(56) References Cited

U.S. PATENT DOCUMENTS

| 5,231,358 | A |   | 7/1993 | Kapsokavathis et al. |
| 6,031,368 | A | * | 2/2000 | Klippel ............. G01R 15/06 |
|           |   |   |        | 324/126 |

(Continued)

FOREIGN PATENT DOCUMENTS

| CA | 2522912   | 3/1998 |
| CN | 20129376 Y | 4/2009 |

(Continued)

OTHER PUBLICATIONS

Search Report for EP Application No. 20181384.7, dated Sep. 22, 2020, 2 pp.

(Continued)

*Primary Examiner* — Farhana A Hoque
(74) *Attorney, Agent, or Firm* — Gregg H. Rosenblatt

(57) ABSTRACT

A sensor for a separable connector includes a plug body, one or more high voltage capacitors, one or more low voltage capacitors, and a low voltage connection. The plug body includes an insulating resin. The plug body can be inserted into the separable connector to encase a high voltage conductor disposed in the separable connector. The one or more high voltage capacitors are encased by the insulating resin and can be electrically coupled to the separable connector at a first end portion when the plug body is inserted. The one or more low voltage capacitors are electrically coupled in series to the one or more high voltage capacitors to form a capacitive voltage divider. The low voltage connection provides a low voltage signal corresponding to a high voltage signal present in the separable connector. Signal conditioning electronics or a memory may also be included.

13 Claims, 7 Drawing Sheets

(56) References Cited

U.S. PATENT DOCUMENTS

| | | | |
|---|---|---|---|
| 7,577,235 | B2 | 8/2009 | Jedlitschka |
| 7,668,685 | B2 | 2/2010 | Kathan et al. |
| 10,161,972 | B2 | 12/2018 | Javora et al. |
| 2007/0126570 | A1 | 6/2007 | Kathan et al. |
| 2013/0319862 | A1* | 12/2013 | Kotowski ........ G01N 27/44704 204/452 |
| 2014/0327431 | A1* | 11/2014 | Nakamura ......... G01R 19/0084 324/130 |
| 2015/0192619 | A1 | 7/2015 | Javora et al. |
| 2018/0024168 | A1 | 1/2018 | Hetzler et al. |

FOREIGN PATENT DOCUMENTS

| | | |
|---|---|---|
| CN | 201876485 | 6/2011 |
| CN | 102830257 | 12/2012 |
| CN | 104101773 A | 10/2014 |
| CN | 204287283 | 4/2015 |
| CN | 105044428 A | 11/2015 |
| EP | 2605416 | 6/2013 |
| EP | 2696206 | 2/2014 |
| EP | 2993480 | 3/2016 |
| EP | 3002594 | 4/2016 |
| EP | 3051299 | 8/2016 |
| EP | 3070481 | 9/2016 |
| KR | 20090095345 | 9/2009 |
| KR | 100990437 | 10/2010 |
| WO | 2002-080308 | 10/2002 |
| WO | 2013-096354 | 6/2013 |
| WO | 2013-096424 | 6/2013 |
| WO | 2014-044408 | 3/2014 |
| WO | 2014-209739 | 12/2014 |
| WO | 2014-209740 | 12/2014 |
| WO | 2016-045692 | 3/2016 |

OTHER PUBLICATIONS

"ElbowSense™ Underground Voltage Sensors", Datasheet, Lindsey, 2015, p. 1.

"Intelligenz für die Mittelspannung", Nexans Power Accessories Germany GmbH, 2016, p. 1.

Udren, "Overview of IEEE C37.92-2005 Standard for Analog Inputs to Protective Relays from Electronic Voltage and Current Transducers", Power Systems Conference and Exposition, 2006, pp. 527-531.

International Search Report for PCT International Application No. PCT/IB2018/053207, dated Aug. 21, 2018, 5 pages.

Search Report for CN Application No. 201880031349.8, dated Apr. 1, 2021, 3 pp.

* cited by examiner

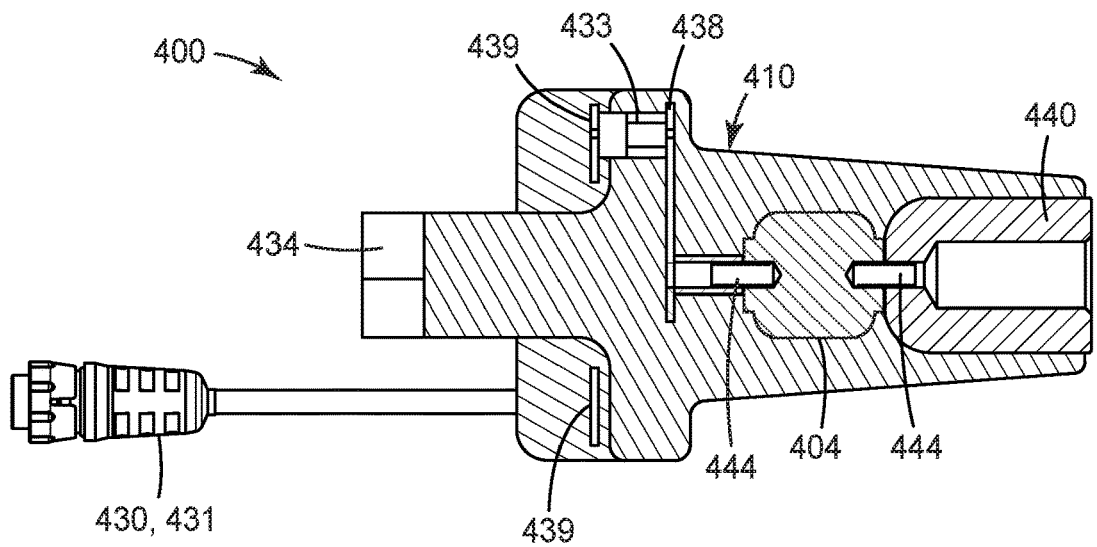
FIG. 8
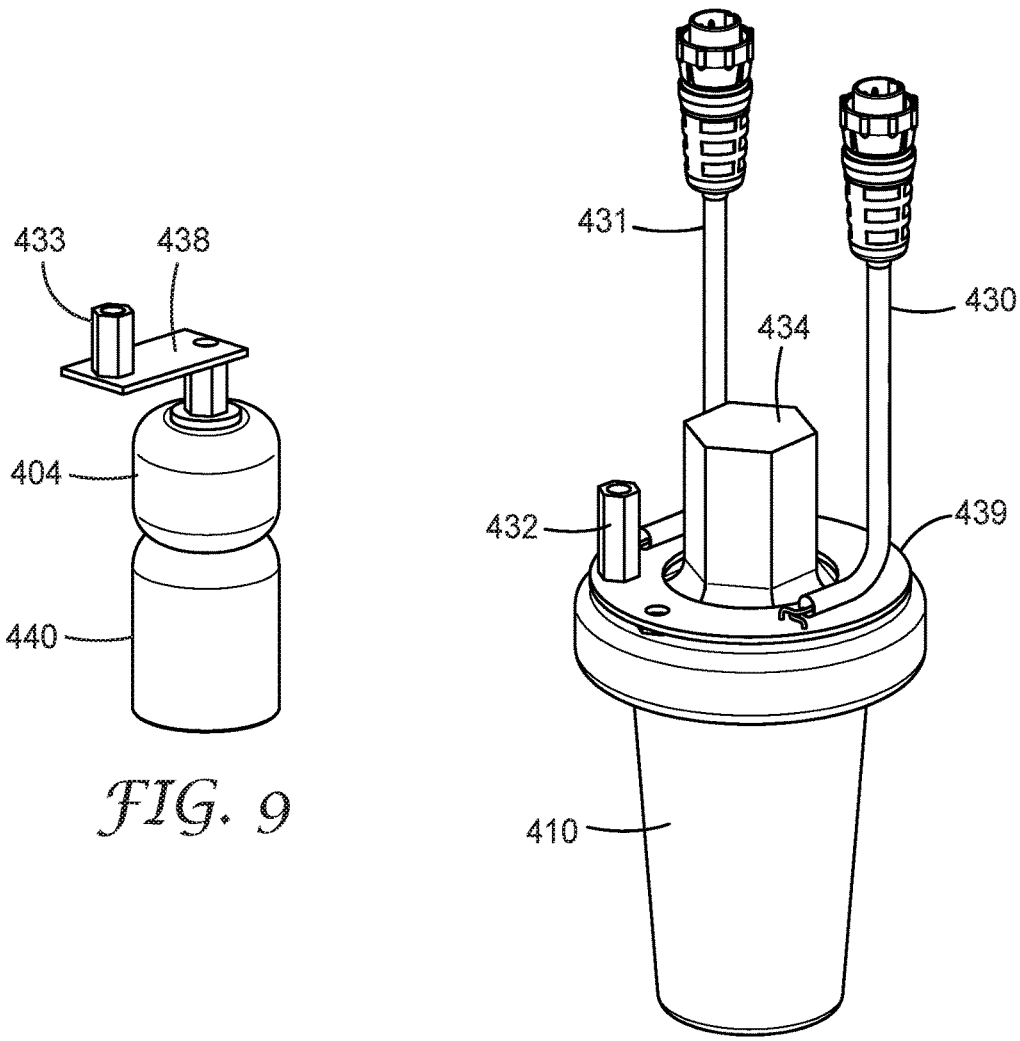
FIG. 9
FIG. 10

SENSORS WITH DISCRETE CAPACITORS FOR HIGH VOLTAGE SEPARABLE CONNECTORS

This disclosure relates to sensors for high voltage and, in particular, relates to sensors for high voltage separable connectors, each having discrete capacitors at least partially encased in an insulating resin that forms at least part of a plug body, which may provide a low voltage signal corresponding to a high voltage signal present in a separable connector.

BACKGROUND

As electrical power distribution becomes more complex through the advent of renewable energy, distributed generation, and the adoption of electric vehicles, intelligent electrical distribution and associated electrical sensing is becoming more useful and even necessary. Useful sensing may include voltage, current, and the time relationship between voltage and current at various locations within a power distribution network.

Many existing relatively high voltage transformers and switchgears have a dedicated space for cable accessories, particularly in higher voltage applications (for example, 5 kV to 69 kV, or higher). Many of these transformers and switchgear are of a variety referred to in the power utility industry as dead-front. Dead-front means there are no exposed relatively high voltage surfaces in the connection between a power cable and the transformer or switchgear. Such cable accessory connections are sometimes referred to as elbows, T-bodies, or separable connectors.

Many cable accessories implement testpoints to provide a scaled fraction of the line voltage residing on the shielded and insulated conductor of the cable accessory. The historical use of these test points is for indication of the presence of line voltage at the transformer or switchgear. Often, these testpoints do not provide the voltage ratio accuracy required for modern grid automation power quality and control applications.

SUMMARY

In general, the present disclosure relates to sensors for high voltage, which may also serve as an insulating plug. This disclosure includes sensors that have discrete capacitors, which may be at least partially incased in an insulating resin that forms at least part of a plug body. The sensors can provide a low voltage signal corresponding to a high voltage signal present in a separable connector. In some examples, this disclosure is directed to sensors for high voltage separable connectors.

Various aspects of the present disclosure are directed to a sensor for a separable connector. The sensor includes a plug body, one or more high voltage capacitors, one or more low voltage capacitors, and a low voltage connection. The plug body has an insulating resin and is configured to be inserted into the separable connector to encase a high voltage conductor disposed in the separable connector. The one or more high voltage capacitors are encased by the insulating resin and configured to be electrically coupled to the separable connector at a first end portion when the plug body is inserted. The one or more low voltage capacitors are electrically coupled in series to the one or more high voltage capacitors to form a capacitive voltage divider. The low voltage connection is configured to provide a low voltage signal corresponding to a high voltage signal present in the separable connector.

It is to be understood that both the foregoing general description and the following detailed description present embodiments of the subject matter of the present disclosure, and are intended to provide an overview or framework for understanding the nature and character of the subject matter of the present disclosure as it is claimed.

BRIEF DESCRIPTION OF THE DRAWINGS

FIG. 8 is a cross-sectional view of the example sensor of FIG. 7.

FIG. 9 is a perspective view of a partially assembled example sensor of FIG. 7 without a plug body.

FIG. 10 is a perspective view of a partially assembled example sensor of FIG. 7 with a partially assembled plug body.

Figure 1:
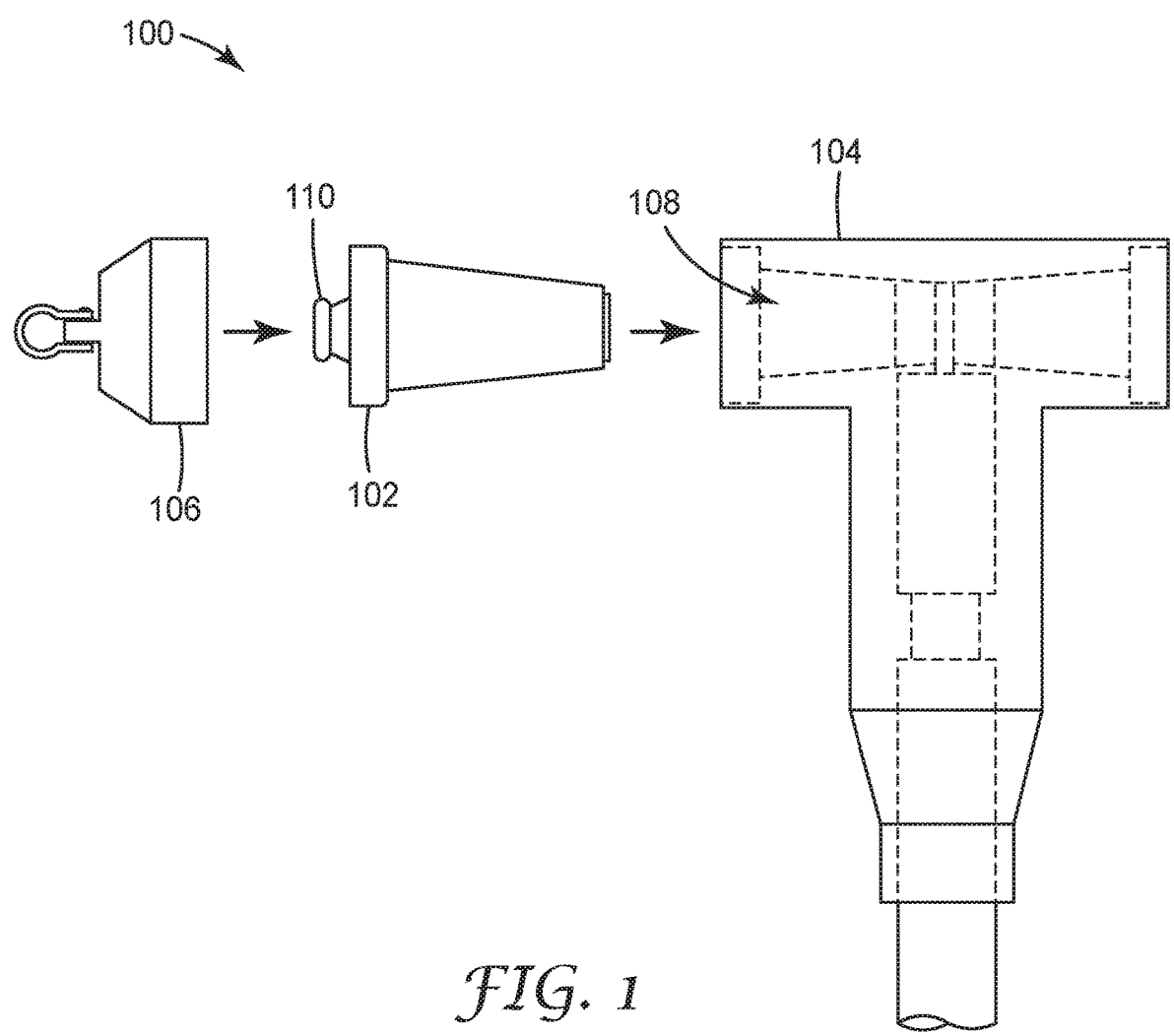
FIG. 1 is an exploded view of a cable accessory system including a separable connector, a sensor, and an insulating cap.

The disclosure may be more completely understood in consideration of the following detailed description of various embodiments of the disclosure and the accompanying drawings.

DETAILED DESCRIPTION

The present disclosure provides sensors for high voltage separable connectors each having discrete capacitors and providing a low voltage signal corresponding to a high voltage signal present in a separable connector at least partially incased in an insulating resin forming at least part of a plug body. The sensor can be used as an insulating plug for the separable connector. One or more high voltage capacitors can be encased by the insulating resin. One or more low voltage capacitors can be encased by the insulating resin. A low voltage connection can provide the low voltage signal, which may correspond to the voltage across the one or more low voltage capacitors. The plug body can be integrated or separable, which may allow one or more components to be separated from other components of the sensor. The sensor may further include a substrate for supporting one or more components. Signal conditioning electronics can be disposed in close proximity to the low voltage signal to provide a conditioned low voltage signal.

The sensors described herein provide convenient and easy-to-use voltage sensing and insulating of a high voltage separable connector. The sensor may serve as an insulating plug that is free of exposed high voltage surfaces when inserted into the separable connector. The voltage sensing capability may be more accurate over a broader operating temperature range and over a broader harmonic frequency range compared to using a resistive voltage divider, which may suffer from parasitic capacitance at higher harmonics or frequencies. The capacitive voltage divider may facilitate measurements beyond the base or fundamental frequency and may facilitate the use of standard high-voltage DC commissioning testing without additional leakage current through the voltage divider. The sensor may be utilized in smart grid applications that require such accuracy. Utilizing a separable plug body for the sensor may allow some components to be maintained or replaced without a service outage or other interruption. Signal conditioning in close proximity may improve the signal to noise ratio of a conditioned voltage signal before the signal picks up additional noise, for example, via transmission over an external cable.

The term "high voltage" as used herein means a voltage equal to or greater than a high voltage threshold. The high voltage threshold may be based on a standard, jurisdictional requirement, or end-user requirement that applies to the particular system being described. For example, high voltage may refer to operating at about the voltage rating defined in a standard, such as the Institute of Electrical and Electronics Engineers (IEEE) Standard 386 (2016) for separable insulated connector systems for power distribution systems rated 2.5 kV through 35 kV (classified as phase-to-phase root-mean-square, or rms), which is incorporated herein by reference for any and all purposes. Depending on the application, the high voltage threshold may be equal to or greater than about 2.5 kV, about 3 kV, about 5 kV, about 15 kV, about 25 kV, about 28 kV, about 35 kV, about 69 kV, or more (classified as phase-to-phase rms).

The term "low voltage" as used herein means a voltage that is less than the high voltage. Low voltage may be defined at or below a low voltage threshold. The low voltage threshold and the high voltage threshold may be the same threshold or a different threshold. A low voltage may be a fraction, or ratio less than 1, of a high voltage. The low voltage may be defined by a threshold fraction, or ratio (for example, less than or equal to about 1:100). Unless otherwise stated in the disclosure herein, low voltage is described using phase-to-ground rms.

The term "separable connector" as used herein means a connection or interface for a high voltage system that can be readily established or broken by engaging or separating the connection at an operating interface. Separable connectors may be fully insulated and shielded and used to terminate and insulate a power cable, insulate another electrical component, or connect an insulated power cable to electrical apparatus, other power cables, or both. Separable connectors may be connected to transformers or switchgears. Some separable connectors may be used for deadfront transformers and switchgears, which refers to having no exposed high voltage surfaces in the connector between a power cable and the transformer or switchgear in the power utility industry. Non-limiting examples of separable connectors include elbow separable insulated connectors and tee separable insulated connectors (for example, a T-Body).

The term "voltage rating" as used herein means a maximum voltage at which a connector is designed to operate. The voltage rating may be measured as the highest phase-to-ground voltage rms for single phase systems or may be measured as the highest phase-to-ground and phase-to-phase voltage rms for three-phase systems. However, any suitable type of voltage rating may be used to describe a maximum operational voltage. Unless otherwise stated in the disclosure herein, voltage rating refers to phase-to-ground rms.

The term "connection" as used herein means an interface, a connector, or other structure used to electrically or mechanically couple components together. For example, a connection may include a plug or socket, a wire, a cable, a conductor on a substrate, a piece of solder, a conductive via, or other similar electrical or mechanical coupling.

The terms "coupled" or "connected" refer to elements being attached to each other either directly (in direct contact with each other) or indirectly (having one or more elements between and attaching the two elements).

FIG. 1 shows a system 100 including the sensor 102, a separable connector 104, and an insulating cap 106. The system 100 and components thereof may be sized and shaped to meet, or otherwise be compatible with, an applicable standard, jurisdictional requirement, or end-user requirement for separable insulated connector systems. For example, the system 100 may be designed to meet the IEEE Standard 386 (2016) for an insulating plug for a separable connector. Specifically, the sensor 102 may be designed to be used as a 600A insulating plug. As another example, the system 100 may be designed to meet a similar International Electrotechnical Commission (IEC) standard, popular in Europe, which may employ a different size and shape for compatibility.

As illustrated, the sensor 102 may be in the shape of an insulating plug. The sensor 102 may be inserted into a receptacle 108 of the separable connector 104 and encase, or otherwise cover, a high voltage conductor, or high voltage conductive surface, disposed within the cavity. The separable connector 104 may include one, two, or more receptacles 108 (for example, in a T-Body).

The sensor 102 may be inserted in the same manner as a conventional insulating plug. In some embodiments, the sensor 102 may include a shoulder and a taper and the receptacle 108 has complimentary features. The high voltage connector of the separable connector 104 may be a threaded rod, and the sensor 102 may include a high voltage connection that has a complementary thread. The sensor 102 may be screwed onto the threaded high voltage conductor to secure the sensor 102 to the separable connector 104.

After being inserted and optionally secured, the sensor 102 may cover all, or at least some, high voltage surfaces in the receptacle 108 that would be otherwise exposed. An extending portion 110 of the sensor 102 may extend out of the receptacle 108 of the separable connector 104. The extending portion 110 may include a torque feature, such as a hex-shaped protrusion (described herein in more detail). The insulating cap 106 may be disposed over the sensor 102 to cover the extending portion 110. The insulating cap 106 may be frictionally secured to the separable connector 104. The insulating cap 106 may slide over at least a portion of the separable connector 104 and may be pulled off to expose the sensor 102. In some embodiments, extending portion 110 of the sensor 102 may have an outer surface that is formed of insulating material, and the insulating cap 106 may not be needed.

The sensor 102 may be a voltage sensor. The sensor 102 may provide a low voltage signal that corresponds to a high voltage signal present in the separable connector 104. The low voltage signal may be described as a voltage channel. The sensor 102 may include one or more capacitors. In some embodiments, capacitors include at least a low voltage capacitor and at least a high voltage capacitor. The capacitors may be arranged as a voltage divider to provide the low voltage signal. For example, the low voltage signal may correspond to the divided voltage signal.

The sensor 102 may provide an accuracy of the low voltage signal representing the high voltage signal that enables use in various smart grid applications for diagnosing degradation or other problems in the connected transformer, switchgear, or the larger connected grid, such as dips, sags, swells and other events. A higher accuracy sensor may facilitate the detection of smaller events or may facilitate more precise diagnosis of events. For example, for VOLT VAR control, a certain accuracy (for example, 0.7%) may be required to detect changes in the system, such as when on-load tap changers in transformers are changed. The accuracy may be defined as being less than or equal to an error value. Non-limiting examples of the error value include about 1%, about 0.7%, about 0.5%, about 0.3%, about 0.2%, about 0.1%, or less.

The temperature range over which the sensor 102 is accurate may be described as an operating temperature range. In the operating temperature range, the accuracy may be less than or equal to the error value for all temperatures within the range. The operating temperature range may be designed to meet a standard, jurisdictional requirement, or end-user requirement. Non-limiting examples of the operating temperature range include a lower end equal to or greater than about −40° C., about −30° C., about −20° C., about −5° C., or higher. Non-limiting examples of the operating temperature range include a higher end equal to or less than about 105° C., about 85° C., about 65° C., about 40° C., or lower. Non-limiting examples of the operating temperature range include being between about −5° C. to about 40° C., about −20° C. to about 65° C., about −30° C. to about 85° C., about −40° C. to about 65° C., and about −40° C. to about 105° C.

The sensor 102 may have a voltage rating, or be rated, to operate in high voltage systems, such as system 100. The sensor 102 may operate as a voltage sensor, an insulating plug, or both. The voltage rating may be designed to meet a standard, jurisdictional requirement, or end-user requirement. Non-limiting examples of the voltage rating of the sensor 102 in a three-phase system include about 2.5 kV, about 3 kV, about 5 kV, about 15 kV, about 25 kV, about 28 kV, about 35 kV, or about 69 kV (classified as phase-to-phase rms). In some embodiments, the voltage rating is at least 5 kV.

The frequency range over which the sensor 102 is accurate may be described as an operating frequency range. The frequency response may be flat or substantially flat, which may correspond to minimum variation, over the operating frequency range. Non-limiting examples of flatness may include plus or minus (+/−) about 3 dB, about 1 dB, about 0.5 dB, and about 0.1 dB. The frequency response may be designed to meet a standard, jurisdictional requirement, or end-user requirement. The operating frequency range may extend to about the 50th harmonic, or even up to the 63rd harmonic, of a base frequency of the high voltage signal present in the separable connector 104. Non-limiting examples of the operating frequency range may include one or more of the base frequency of about 60 Hz (or about 50 Hz), the 50th harmonic of about 3 kHz (or about 2.5 kHz), the 63rd harmonic of about 3.8 kHz (or about 3.2 kHz), and higher. The frequency response may also remain stable over all or substantially all the operating temperature range. Certain remote terminal units (RTUs) or intelligent electronic devices (IEDs) may take advantage of one or more of these higher order harmonics.

Figure 2A:
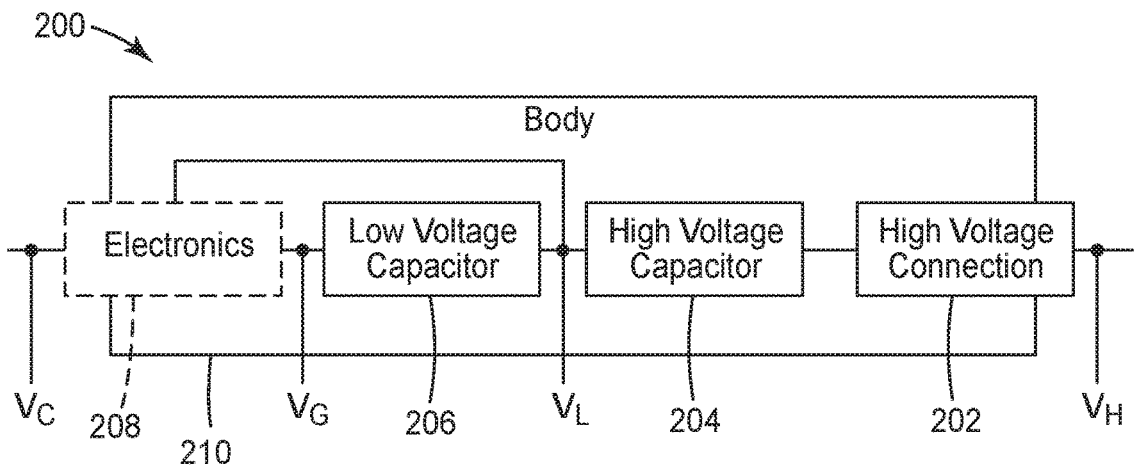
FIGS. 2A, 2B, and 2C are schematic illustrations of various sensor configurations for use with the system of FIG. 1.
Figure 2B:
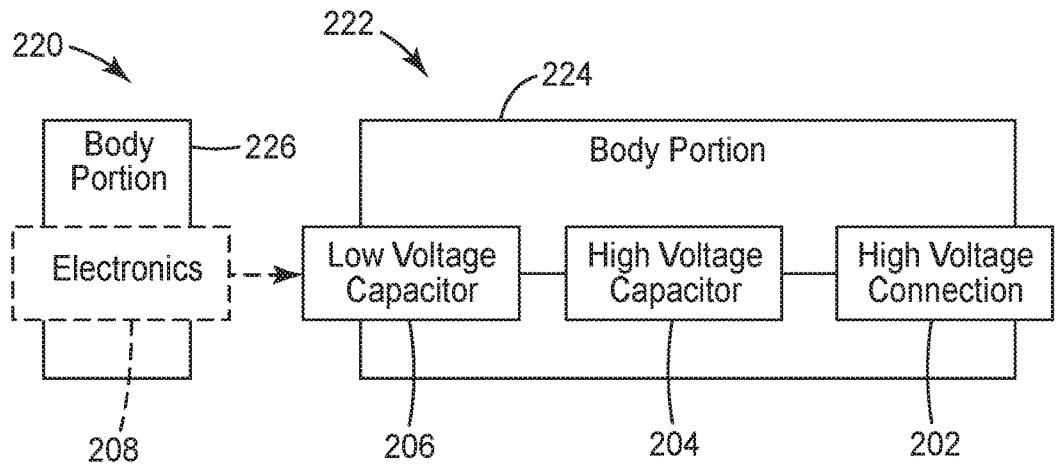
Figure 2C:
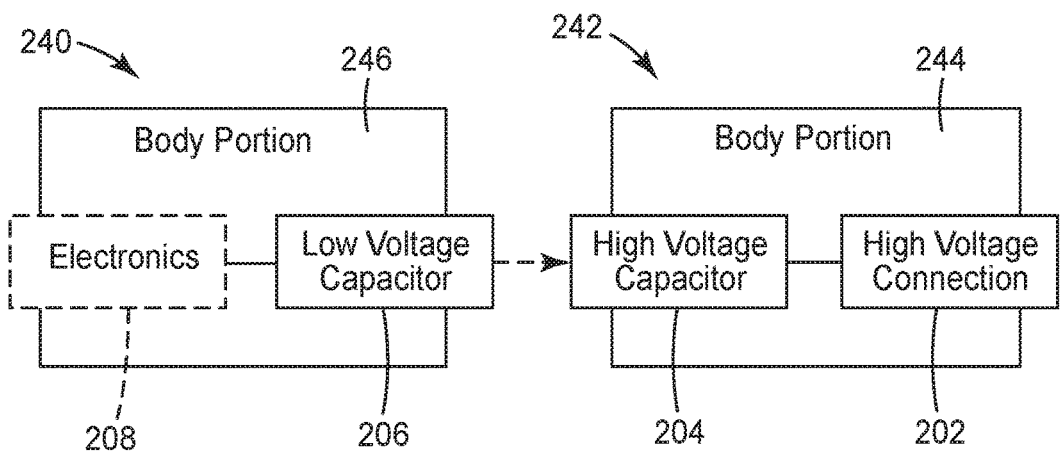

FIGS. 2A, 2B, and 2C show various configurations 200, 220, 240 for a voltage sensor of the present disclosure, such as voltage sensor 102. Each configuration 200, 220, 240 includes a high voltage connection 202, one or more high voltage capacitors 204, one or more low voltage capacitors 206, and optional electronics 208. One or more of these components may be encased by the plug body 210, 222, 242 or portions thereof. The portions encased by the plug body 210, 222, 242 may be considered part of the plug body. The plug body 210, 222, 242 may be formed of, or at least partially formed of, an insulating material, such as an insulating resin or other insulating polymer. In some embodiments, the capacitors 204, 206 are formed of different capacitive material than the plug body 210, 222, 242.

The high voltage connection 202 may be required to withstand the full voltage of the separable connector, such as separable connector 104. The one or more high voltage capacitors 204 and the plug body 210, 222, 242 may be required to withstand, at least partially, voltage of the separable connector.

Any suitable resin with high dielectric strength and suitable mechanical properties for transferring torque between components may be used. For example, a cycloaliphatic epoxy may be used as the insulating resin. In some embodiments, a portion of the plug body may be formed of a different polymer, such as a polycarbonate, an acetal thermoplastic, or a phenolic composite.

The high voltage connection 202 may receive a high voltage signal $V_H$ from a separable connector, such as separable connector 104. In particular, the high voltage connection 202 may couple to a high voltage conductor disposed in the separable connector. In particular, the high voltage connection 202 may encase the high voltage conductor of the separable connector. The high voltage connection 202 may be formed of any suitable conductive material. The high voltage connection 202 may be formed of the same material as the high voltage conductor disposed in the separable connector, which may facilitate thermal-mechanical compatibility. In some embodiments, the high voltage connection 202 includes any suitable conductive material. Non-limiting examples of material for the high voltage connection 202 include aluminum and copper. Aluminum may be utilized in 600 amp systems. Copper may be utilized in 900 amp systems.

The one or more high voltage capacitors 204 may be operatively coupled to the high voltage connection 202 and the one or more low voltage capacitors 206. In some embodiments, at least some high voltage capacitors 204 are electrically coupled in series, in parallel, or both. The one or more low voltage capacitors 206 may be the same or different (for example, in capacitance, voltage rating, size, mounting style, or shape). In some embodiments, more high voltage capacitors 204 may be couples in series for higher sensor voltage ratings. When at least a portion of the plug body 210, 222, 242 is inserted into the separable connector, the one or more high voltage capacitors 204 may be electrically coupled to the separable connector through the high voltage connection 202. Each of the high voltage capacitors 204 may have a higher voltage rating than each of the low voltage capacitors 206. Non-limiting examples of the voltage rating for the high voltage capacitors 204 includes ratings of at least about 2.5 kV, about 3 kV, about 5 kV, about 10 kV, about 15 kV, about 20 kV, about 25 kV, or about 30 kV.

Each of the high voltage capacitors 204 has a capacitance. In some embodiments, the capacitance may be selected in a range from about 10 pF to about 100 pF. Non-limiting examples of the capacitance include about 10 pF, about 30 pF, about 50 pF, about 70 pF, and about 90 pF.

Each of the high voltage capacitors 204 has an impedance. The magnitude of the impedance at a base frequency (for example, 50/60 Hz) may be equal to a large impedance value, such as about 100 MΩ.

Each of the high voltage capacitors 204 may be a ceramic capacitor. Ceramic capacitors may provide accuracy and stability over the operating temperature range. Non-limiting examples of types of ceramic capacitors include class 1 dielectrics, such as C0H, C0G, and NP0.

Each of the high voltage capacitors 204 may be encased by the insulating resin of the plug body 210, 222, 242.

The one or more low voltage capacitors 206 may be operatively coupled to the one or more high voltage capacitors 204 and the optional electronics 208. The one or more low voltage capacitors 206 may be electrically coupled in series to the one or more high voltage capacitors 204. In some embodiments, at least some low voltage capacitors 206 are electrically coupled in series, in parallel, or both. The one or more low voltage capacitors 206 may be the same or different (for example, in capacitance, voltage rating, size, mounting style, or shape). The one or more low voltage capacitors 206 may be electrically coupled in series to the one or more high voltage capacitors 204. A low voltage signal $V_L$ may be provided between the one or more low voltage capacitors 206 and the one or more high voltage capacitors 204. A ground $V_G$ provided at an opposite end of the one or more low voltage capacitors 206 may be coupled to a system ground.

Each of the low voltage capacitors 206 has a capacitance. In some embodiments, the capacitance may be selected in a range from about 0.1 µF to about 1 µF. Non-limiting examples of the capacitance include about 0.1 µF, about 0.3 µF, about 0.5 µF, about 0.7 µF, and about 0.9 µF. The capacitance value may be selected to provide a capacitance ratio of the high voltage capacitors 204 to the low voltage capacitors 206 of about 100:1, about 1,000:1, about 10,000:1, or about 100,000:1.

Each of the low voltage capacitors 206 has an impedance. The magnitude of the impedance at the base frequency (for example, 50/60 Hz) may be equal to a low impedance, such as about 10 kΩ.

Each of the low voltage capacitors 206 may be a ceramic capacitor. Ceramic capacitors may provide accuracy and stability over the operating temperature range. Each of the low voltage capacitors 206 may be a surface mount capacitor. The size of each of the low voltage capacitors 206 may be smaller than the size of each of the high voltage capacitors 204.

Each of the low voltage capacitors 206 may be encased by the insulating resin of the plug body 210 or a portion 224, 246 of the plug body 222, 242.

The capacitors 204, 206 may divide the high voltage signal $V_H$ to provide the low voltage signal $V_L$. The low voltage signal $V_L$ may be a fraction of the high voltage signal $V_H$. Non-limiting examples of the low to high voltage ratio ($V_L$ to $V_H$) may be about 1:100, about 1:1,000, about 1:10,000, or about 1:100,000. The low voltage signal $V_L$ may have a maximum voltage less than or equal to about 0.5 V, about 1 V, about 10 V, about 42 V, about 100 V, or about 300 V.

The electronics 208 may be operatively coupled to the one or more low voltage capacitors 206. The electronics 208 may receive the low voltage signal $V_L$. The electronics 208 may provide a conditioned voltage signal $V_C$ to a low voltage connection. The electronics 208 may be coupled to the ground $V_G$.

The electronics 208 may be coupled in close proximity to the high voltage signal $V_H$ and the low voltage signal $V_L$. In some embodiments, the electronics 208 are integrated into the same plug body 210 as the capacitors 204, 206. In some embodiments, the electronics 208 are separably connected to the one or more low voltage capacitors 206. In some embodiments, the electronics 208 are integrated into the same portion (for example, portion 246 of the plug body 242) as the one or more low voltage capacitors 206, which are separably connected to the one or more high voltage capacitors 204.

Signal conditioning may be included in the electronics 208. Non-limiting examples of signal conditioning include voltage amplification, voltage filtering, voltage line driving or buffering, current amplification, current integration, current filtering, and current line driving or buffering. The conditioned signal may be capable of being transmitted over an external cable to an RTU or other equipment.

Memory may be included in the electronics 208. Memory may be disposed on a single component or may be disposed on two or more discrete components. In some embodiments, a portion of the memory may be disposed on different portions of the plug body 210, 222, 242. In some embodiments, the memory may be disposed remote from signal conditioning electronics (for example, outside of the plug body).

The memory may be operatively coupled to a low voltage connection and store data, such as a unique product identifier, data of manufacture, a calibration ratio for the voltage divider, and a gain value for the signal conditioning electronics.

The unique product identifier may correspond to the specific sensor, such as a serial number.

The calibration ratio may include a voltage ratio and a current ratio for the specific sensor. The sensor may be pre-calibrated before reaching the end user or be calibrated on-site. In some embodiments, the calibration ratio may be updated as the components age or certain separable components are replaced or otherwise changed.

Equipment that uses the sensor may be able to retrieve the unique product identifier and calibration ratio. The stored calibration may be automatically read by connected equipment to automate application of a stored ratio value by connected equipment. Compared to manual entry of such values, automated application may save time, may avoid incorrect or mistaken data entry, and may reduce the likelihood of other errors.

Certain locations within the memory may be left empty for storage of installation data by the end user upon installation. For example, the location, connected equipment, installers name, and voltage phase (typically A, B, or C) could be programmed upon installation. This may leave an "as-built" record within the sensor that could be automatically read later.

The memory may appear on a bus with several sensors or electronics able to be interrogated to determine characteristics and the relationship between connected devices, for example, via a low voltage connector.

A controller may be included in the electronics 208. The controller may manage access to the memory or include the memory. In some embodiments, the controller facilitates communication between the sensor and connected equipment.

A controller may include a processor, such as a central processing unit (CPU), computer, logic array, or other device capable of directing data coming into or out of the sensor. In some embodiments, the controller includes one or more computing devices having memory, processing, and communication hardware. The functions of the controller may be performed by hardware and/or as computer instructions on a non-transient computer readable storage medium.

The plug body 210, 222, 242 may be arranged as an integrated body or as a separable body. In some embodiments, such as configuration 200, the plug body 210 is an integrated body. The plug body 210 encases the high voltage connection 202, the one or more high voltage capacitors 204, the one or more low voltage capacitors 206, and the electronics 208.

In some embodiments, such as configuration 220, the plug body 222 includes a first portion 224 and a second portion 226 connectable and separable from the first portion. The first portion 224 encases the high voltage connection 202, the one or more high voltage capacitors 204, and the one or more low voltage capacitors 206. The second portion 226 encases the electronics 208. The electronics 208 can be replaced, or otherwise changed, while the sensor is inserted into the separable connector without a service outage.

In some embodiments, such as configuration 240, the plug body 242 includes a first portion 244 and a second portion 246 connectable and separable from the first portion. The first portion 244 encases the high voltage connection 202 and the one or more high voltage capacitors 204. The second portion 246 encases the one or more low voltage capacitors 206 and the electronics 208. The electronics 208, the one or more low voltage capacitors 206, or both can be replaced, or otherwise changed, while the sensor is inserted into the separable connector without a service outage.

The separable plug bodies 222, 242 may define the first portion 224, 244 as a high voltage end portion and the second portion 226, 246 as a low voltage end portion. The low voltage end portion may be considered the separable portion. The high voltage end portion may be considered the separable portion. Either the low voltage end portion or the high voltage end portion may be considered as a sensor assembly end portion.

The different portions 224, 226, 244, 246 of the separable plug bodies 222, 242 may be formed of the same or different material. One or both portions 224, 226, 244, 246 of the separable plug bodies 222, 242 may be formed of an insulating material, such as an insulating resin, polycarbonate, acetal thermoplastic, or phenolic composite.

Components such as the electronics 208 and the one or more low voltage capacitors 206 may need to be maintained, replaced, or otherwise changed more often than other components, such as the one or more high voltage capacitors 204, the high voltage connection 202, and the plug body 210, 222, 242.

Figure 3:
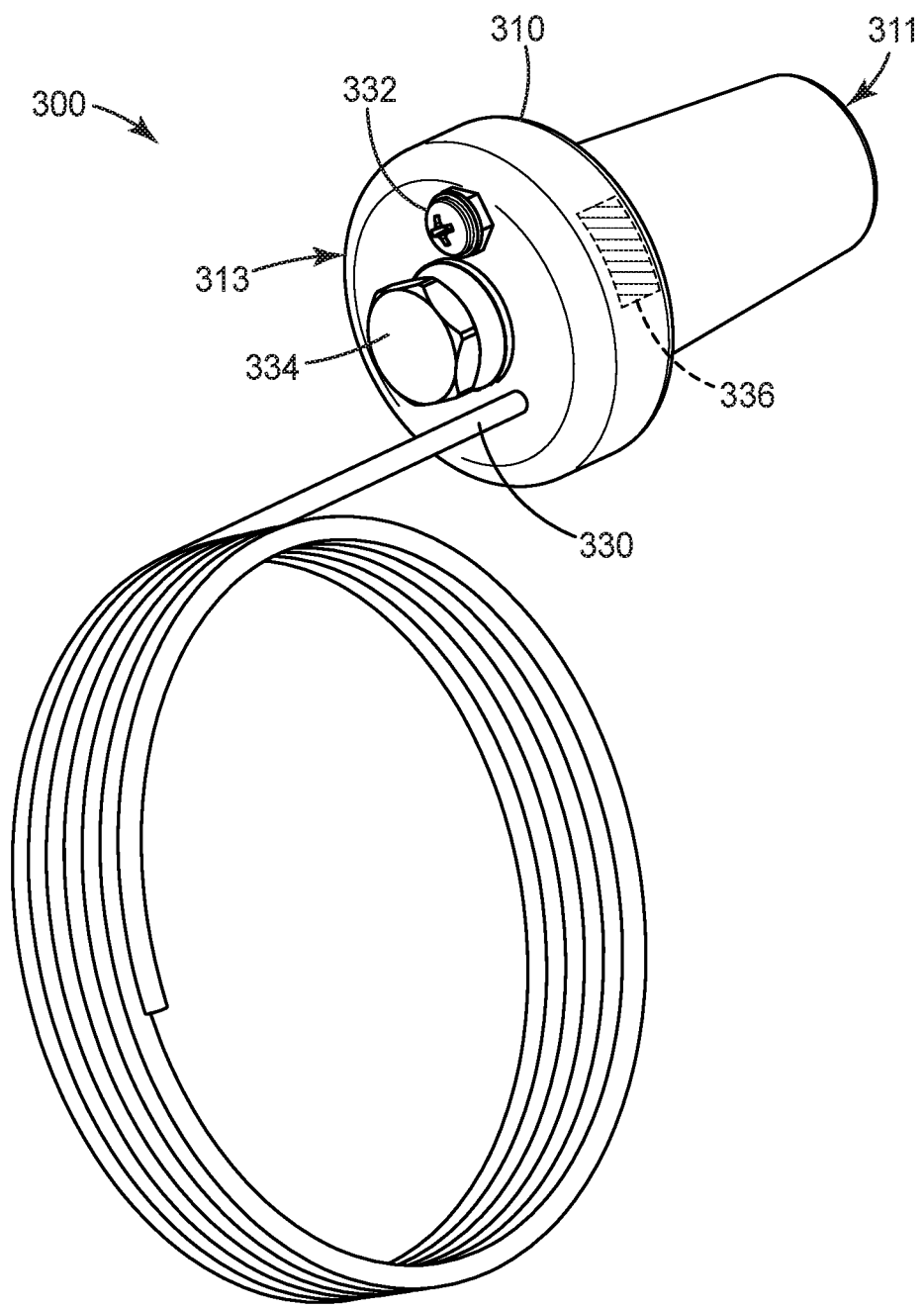
FIG. 3 is a perspective view of an example sensor.
Figure 4:
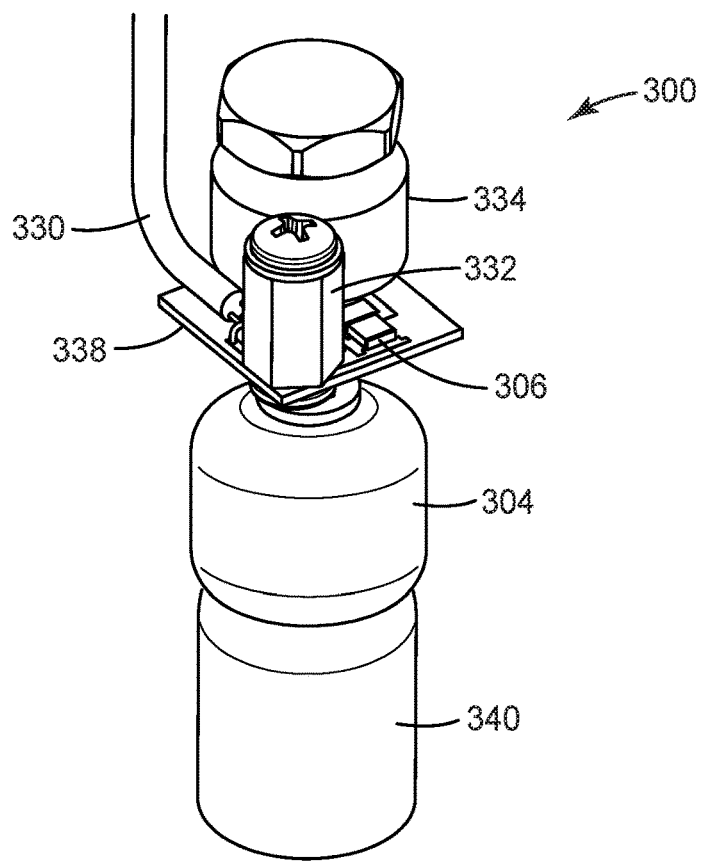
FIG. 4 is a perspective view of the example sensor of FIG. 4 without a plug body.
Figure 5:
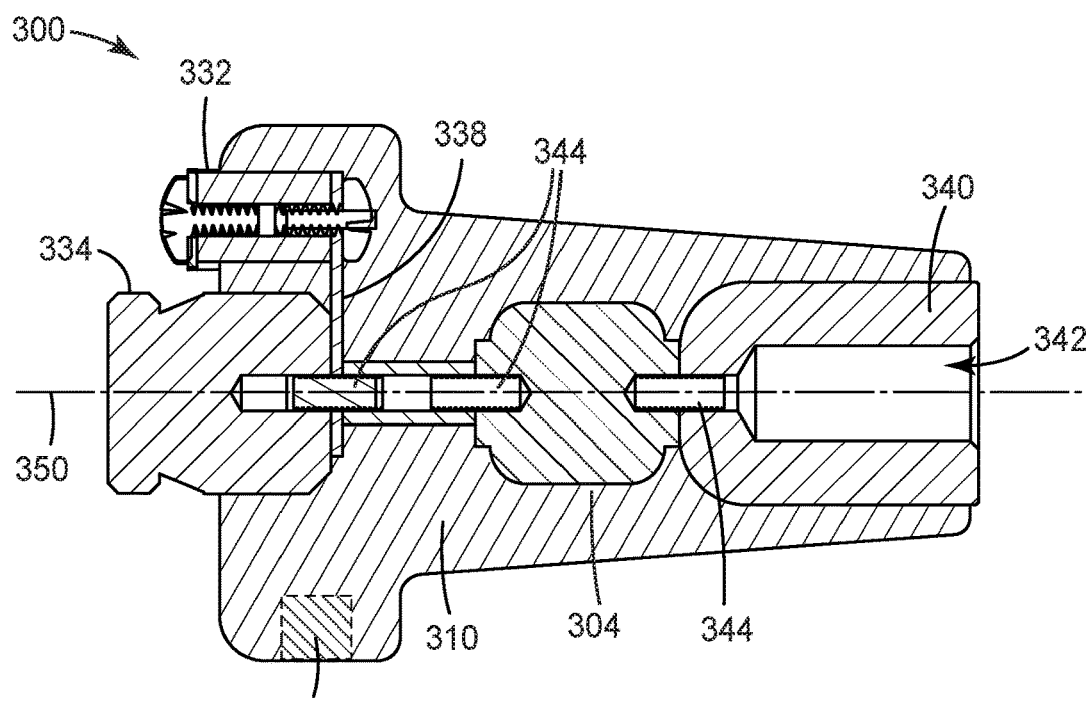
FIG. 5 is a cross-sectional view of the example sensor of FIG. 4 in a plane extending through the example sensor along a longitudinal axis.
Figure 6:
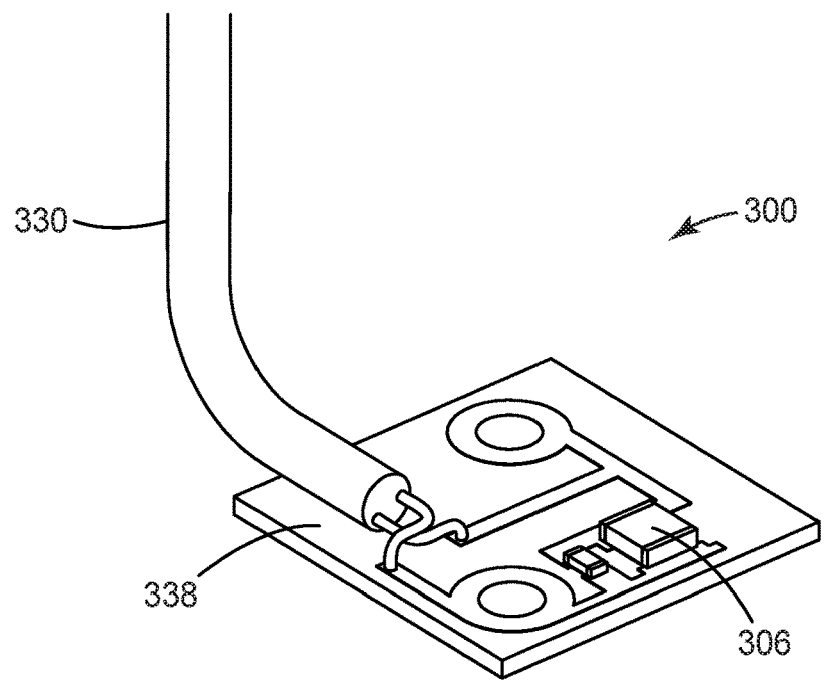
FIG. 6 is a perspective view of a substrate of the example sensor of FIG. 4.

FIGS. 3, 4, 5, and 6 show different views of an example sensor 300. FIG. 3 shows a perspective view of the example sensor 300. FIG. 4 shows a perspective view of the example sensor 300 without a plug body 310. FIG. 5 shows a cross-sectional view of the example sensor 300. FIG. 6 shows a perspective view of a substrate 338 supporting some other components of the example sensor 300.

Many of the parts and components depicted in FIGS. 3-6 are the same or similar to those depicted in, and described with regard to, other figures described herein. Reference is made to the discussion regarding other figures described herein for similarly numbered elements depicted in, but not specifically discussed in detail with regard to, FIGS. 3-6.

As illustrated, the example sensor 300 includes a plug body 310, a low voltage connection 330 including a cable that provides the low voltage signal $V_L$ to external equipment, a ground connection 332 connected to the ground $V_G$, and a torque feature 334 including a hex-shaped protrusion. The plug body 310 is an integrated plug body. The torque feature 334 is separately formed from the plug body 310 and may be formed of different material than the plug body. In one alternative embodiment, torque feature 334 can comprise a conductive or semiconductive material. For example, torque feature 334 may comprise aluminum. The ground connection 332 is electrically coupled to the one or more low voltage capacitors 306.

The plug body 310 may extend from a high voltage end portion 311 to a low voltage end portion 313. The cable of the low voltage connection 330 may extend from the low voltage end portion 313. The cable may be a shielded, twisted pair cable. As illustrated, the plug body 310 may encase the high voltage connection 340, one or more rods 344, the one or more high voltage capacitors 304, and the substrate 338 with low voltage capacitors 306.

An optional torque feature 336 (shown schematically) can include one or more recesses formed in the plug body 310, which may be in the insulating resin. The one or more recesses may be disposed laterally to, or radially from, a longitudinal axis 350 that extends through the center of the example sensor 300 and the hex torque feature 334. The one or more recesses may be sized and shaped to receive a portion of a wrench (for example, a spanner wrench) that can be manipulated to twist the example sensor 300 onto the threaded high voltage conductor in the separable conductor.

The plug body 310 may transfer torque from the low voltage end portion 313 to the high voltage end portion 311 to secure the sensor to the separable connector. In particular, the plug body 310 may transfer torque between the torque features 334, 336 and the high voltage connection 340. In some embodiments, the plug body 310 (for example, the insulating resin) is bonded to or otherwise coupled to the torque feature 334 and the high voltage connection 340. An exterior surface of the torque feature 334 or the high voltage connection 340 may have a textured surface, which may be formed by knurling, to which the material of the plug body 310 can bond.

As shown, the high voltage connection 340 includes a cavity 342 for receiving and covering the high voltage conductor of the separable connector. The high voltage connection 340 may be threaded on an inner surface defining the cavity 342 and coupled to the high voltage conductor by the threading when the example sensor 300 is inserted into the separable connector.

A substrate 338 may be included to support the one or more low voltage capacitors 306 and any optional electronics. As shown, two low voltage capacitors 306 are disposed on the substrate 338 and have different sizes. As illustrated, the low voltage connection 330, the ground connection 332, and the torque feature 334 are also coupled to the substrate 338. The substrate 338 may be a printed circuit board. The substrate 338 may include conductors, such as traces or wires, to facilitate mechanical connection, electrical connection, or both to other components. As shown, the conductors of the substrate 338 connect the low voltage capacitors 306 in parallel. The substrate 338 may include through holes to facilitate mechanical coupling to one or more rods 344, the ground connection 332, or both.

The example sensor 300 may be mechanically assembled to incorporate the one or more discrete capacitors 304, 306. One or more rods 344 may be used to mechanically and electrically couple other components of the example sensor 300. However, any suitable mechanical and electrical coupling mechanism or combinations thereof may be used. In some embodiments, rods 344 are threaded and coupled to other components with complementary threads. In some embodiments, the rods 344 are press fit to each of the components. At least some components may be coupled by the rods 344 before the plug body 310 is formed about at least some of the components. For example, the high voltage connection 340, the one or more high voltage capacitors 304, the substrate 338, and the torque feature 334 may be coupled by one rod 344 disposed between each adjacent component along the longitudinal axis 350. The rods 344 provide axial and lateral rigidity to the example sensor 300. The plug body 310 (for example, insulating resin) may be formed around those components to further mechanically couple the components together. The plug body 310 may further the rigidity in the same manner and also add rotational rigidity to allow torque to be transferred through the sensor. In some embodiments, the one or more rods 344 may be secured (prevented from backing out) with polymeric thread locking compound (conductive or non-conductive), a mechanical feature to lock the thread, or a nylon thread locking insert, which may facilitate torque transfer through the sensor.

Figure 7:
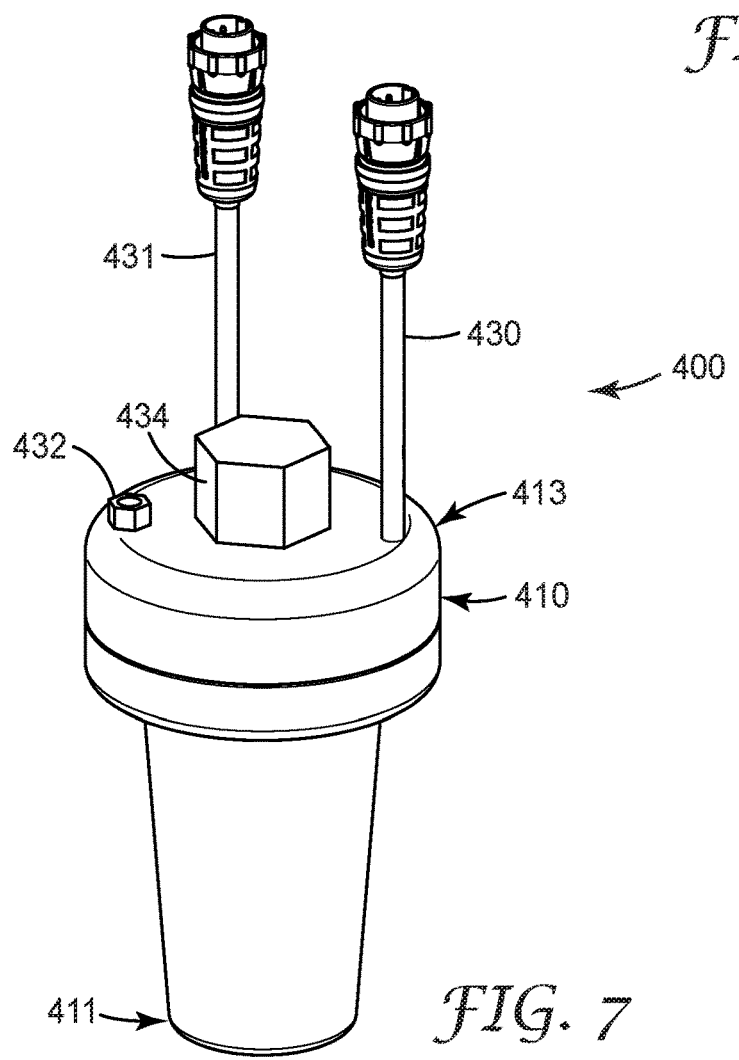
FIG. 7 is a perspective view of another example sensor.

FIGS. 7, 8, 9, and 10 show different views of an example sensor 400. FIG. 7 shows a perspective view of the example sensor 400 as finally assembled. FIG. 8 shows a cross-sectional view of the example sensor 400. FIG. 9 shows a perspective view of a partially assembled example sensor 400 without a plug body 410. FIG. 10 shows a perspective view of a partially assembled example sensor 400 with a partially assembled plug body 410.

Many of the parts and components depicted in FIGS. 7-10 are the same or similar to those depicted in, and described with regard to, other figures described herein. Reference is made to the discussion regarding other figures described herein for similarly numbered elements depicted in, but not specifically discussed in detail with regard to, FIGS. 7-10.

As illustrated, the example sensor 400 includes a plug body 410, a low voltage connection 430 including a cable that provides the low voltage signal $V_L$ to external equipment, another low voltage connection 431 including a cable that receives a signal, a ground connection 432 connected to the ground signal $V_G$, and a torque feature 434 including a hex-shaped protrusion. The plug body 410 is an integrated plug body. The torque feature 434 is integrally formed into the plug body 410 and may be formed of the same material as the plug body. The example sensor 400 can include a torque feature including one or more recesses in the plug body (not shown here). In another embodiment, the torque feature 434 may be formed from a conductive or semiconductive material or may include a conductive or semiconductive material within an insulating resin or similar material.

The plug body 410 may extend from a high voltage end portion 411 to a low voltage end portion 413. Cables of the low voltage connections 430, 431 may extend from the low voltage end portion 413. As shown, the cables may be similar to the cables of example sensor 300 but may be terminated, for example, by sockets. As illustrated, the plug body 410 may encase the high voltage connection 440, one or more rods 444, the one or more high voltage capacitors 404, a first substrate 438 with low voltage capacitors, and a second substrate 439 with electronics (for example, signal conditioning electronics).

An intermediate ground connection 433 may mechanically and electrically couple the first substrate 438 to the second substrate 439. The ground connection 432 may electrically couple to the intermediate ground connection 433.

The low voltage connection 430, 431 may include the same type of cable. The low voltage connection 431 may be connected to equipment and receive a signal, for example, from a Rogowski coil. The signal from the Rogowski coil may correspond to a current signal present in the separable connector and may be described as a current channel. The signal can be refined before being passed through the low voltage connection 430. The sensor 102 may condition the signal corresponding to the current signal and combine the voltage and current channels into a single multi-conductor cable for connection to the RTU. A memory may also be accessed through the low voltage connection 430.

In some embodiments, the plug body 410 may be formed with multiple pours of resin. A first pour may encapsulate the high voltage connection 440, the one or more high voltage capacitors 404, and the first substrate 438 (FIG. 10). A second pour may encapsulate the second substrate 439 to form the finally assembled example sensor 400 (FIG. 7).

Figure 11:
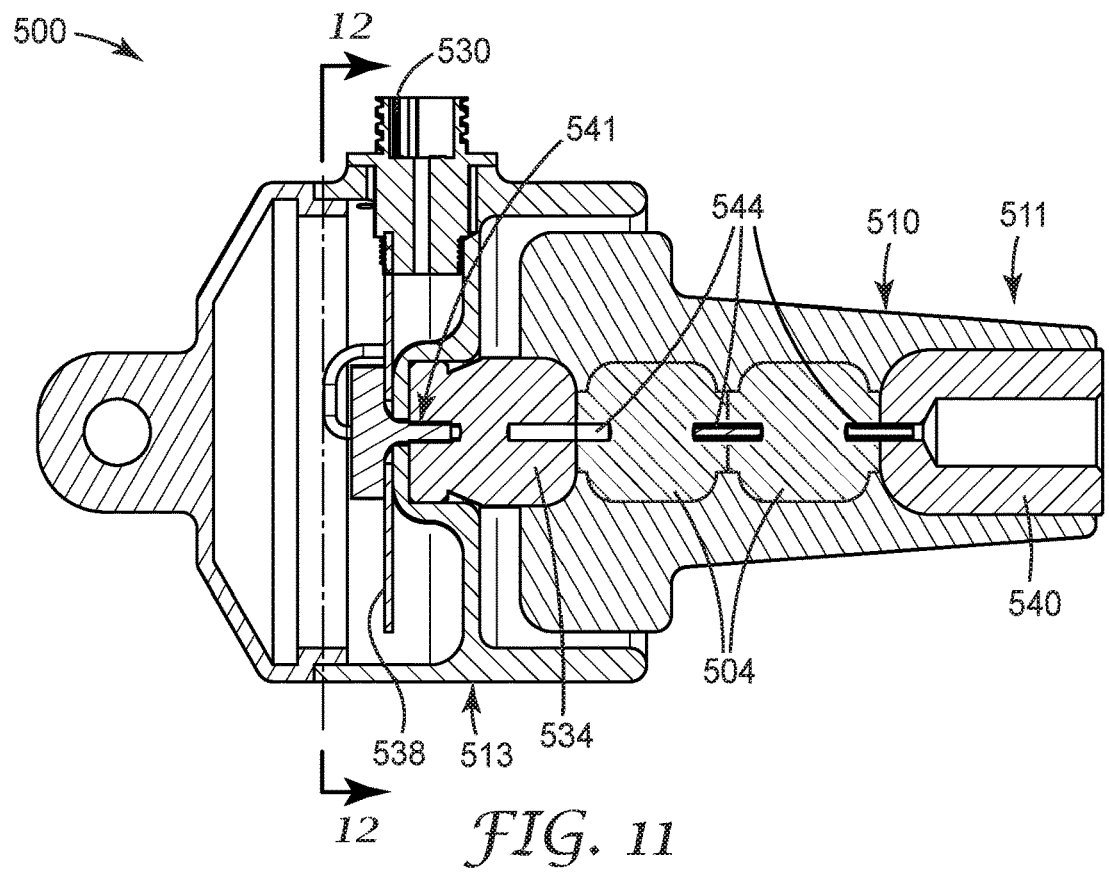
FIG. 11 is a cross-sectional view of a further example sensor.
Figure 12:
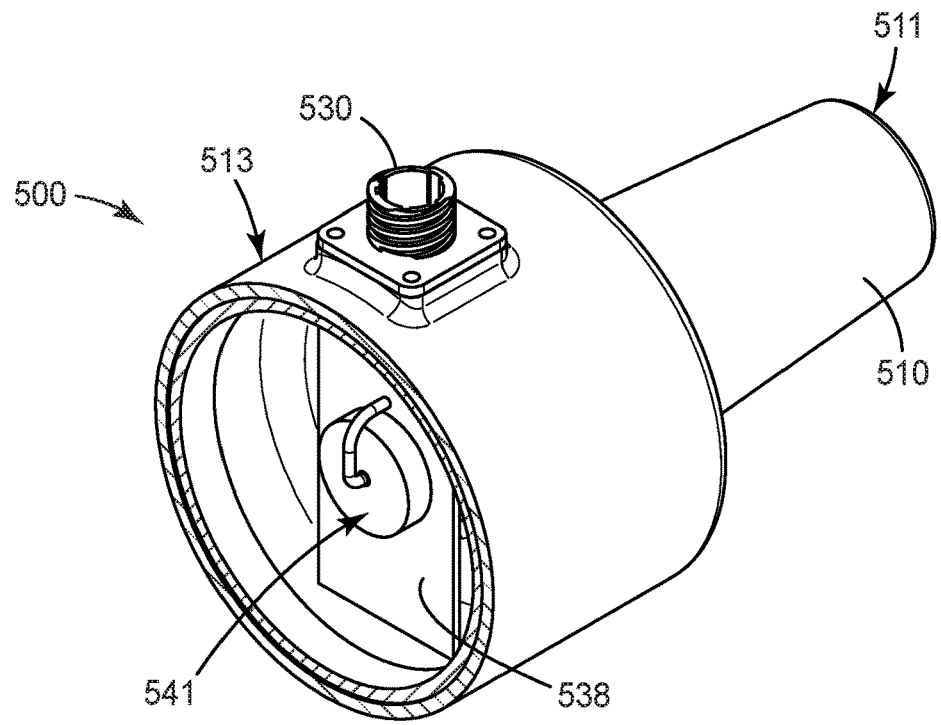
FIG. 12 is a perspective, cutaway end view of the example sensor of FIG. 11 along line 12-12.

FIGS. 11 and 12 show different views of an example sensor 500. FIG. 11 shows a cross-sectional view of the example sensor 500. FIG. 12 shows a cutaway perspective end view of the example sensor 500.

Many of the parts and components depicted in FIGS. 11 and 12 are the same or similar to those depicted in, and described with regard to, other figures described herein. Reference is made to the discussion regarding other figures described herein for similarly numbered elements depicted in, but not specifically discussed in detail with regard to, FIGS. 11 and 12.

As illustrated, the example sensor 500 includes a plug body 510, one or more high voltage capacitors 504, a low voltage connection 530 that provides the low voltage signal $V_L$ to external equipment, a ground connection 432 connected to the ground $V_G$, a torque feature 534 including a hex-shaped protrusion, a high voltage connection 540, and one or more rods 544 coupled to other components of the sensor. As shown, more than one high voltage capacitor 504 is connected in series. The plug body 410 is a separable plug body. The torque feature 434 is separately formed from the resin of the plug body and may be conductive.

The plug body 510 may extend from a high voltage end portion 511 to a low voltage end portion 513, which may be connectable and separable from the high voltage end portion. The low voltage end portion 513 may be an insulating cap that is separably connected to the high voltage end portion 511, similar to the form of insulating cap 106. The torque feature 534 may be disposed at one end of the high voltage end portion 511. An intermediate connector 541 may form an electrical connection, a mechanical connection, or both to the torque feature 534. The intermediate connector 541 may be a spring contact, such as a pogo pin, and may include an insulating support to couple to the substrate 538. The low voltage end portion 513 may support the substrate 538 and the low voltage connection 530. The substrate 538 may support the intermediate connector 541. The substrate 538 may support electronics, such as signal conditioning electronics that provide a conditioned voltage signal $V_C$ through the low voltage connection 430 or another connection.

The exemplary sensor configurations described herein may be utilized in a number of different separable connector products, including shielded terminations, specifically, basic insulating plugs or dead-end plugs. In addition, the sensors and products incorporating such sensors can be utilized in a network, such as an electrical grid network.

Thus, embodiments of the SENSORS WITH DISCRETE CAPACITORS FOR HIGH VOLTAGE SEPARABLE CONNECTORS are disclosed. Those skilled in the art will appreciate that various adaptations and modifications of the exemplary and alternative embodiments described herein can be configured without departing from the scope and spirit of the invention. Therefore, it is to be understood that, within the scope of the appended claims, the invention may be practiced other than as specifically described herein. For example, the example embodiments described herein may be combined in a variety of ways with each other.

All references and publications cited herein are expressly incorporated herein by reference in their entirety into this disclosure, except to the extent they may directly contradict this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (for example 1 to 5 includes 1, 1.5, 2, 2.75, 3, 3.80, 4, and 5) and any range within that range. Herein, the terms "up to" or "no greater than" a number (for example, up to 50) includes the number (for example, 50), and the term "no less than" a number (for example, no less than 5) includes the number (for example, 5).

Terms related to orientation, such as "end", are used to describe relative positions of components and are not meant to limit the orientation of the embodiments contemplated.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open-ended sense, and generally mean "including, but not limited to". It will be understood that "consisting essentially of", "consisting of", and the like are subsumed in "comprising," and the like.

The term "and/or" means one or all of the listed elements or a combination of any two or more of the listed elements (for example, casting and/or treating an alloy means casting, treating, or both casting and treating the alloy).

The phrases "at least one of," "comprises at least one of," and "one or more of" followed by a list refers to any one of the items in the list and any combination of two or more items in the list.

What is claimed is:

1. A sensor for a separable connector comprising:
   a plug body comprising an insulating resin, the plug body configured to be inserted into the separable connector to encase a high voltage conductor disposed in the separable connector;
   one or more high voltage capacitors encased by the insulating resin and configured to be electrically coupled to the separable connector at a first end portion when the plug body is inserted;
   one or more low voltage capacitors electrically coupled in series to the one or more high voltage capacitors to form a capacitive voltage divider; and
   a low voltage connection configured to provide a low voltage signal corresponding to a high voltage signal present in the separable connector;
   wherein the low voltage signal corresponds to the high voltage signal in a ratio between about 1:100 and about 1:100,000.

2. The sensor according to claim 1, wherein the insulating resin is configured to transfer torque from a low voltage first end portion of the plug body to a high voltage second end portion of the plug body to secure the sensor to the separable connector.

3. The sensor according to claim 1, wherein the plug body further comprises a torque feature comprising at least one of:
   a protrusion feature, and
   one or more recesses in the insulating resin.

4. The sensor according to claim 3, wherein the protrusion feature is formed by the insulating resin or is formed of a separate insulating material.

5. The sensor according to claim 1, wherein a threaded rod mechanically and electrically couples the at least one of the high voltage capacitors with at least one of:
   the one or more low voltage capacitors, and
   another of the one or more high voltage capacitors.

6. The sensor according to claim 1, further comprising a substrate supporting the one or more low voltage capacitors.

7. The sensor according to claim 1, further comprising signal conditioning electronics configured to electrically couple to the one or more low voltage capacitors.

8. The sensor according to claim 1, wherein the plug body comprises a low voltage end portion separable from the plug body comprising a first portion including the one or more low voltage capacitors and a second portion separably connected to the first portion including the one or more high voltage capacitors.

9. The sensor according to claim 1, further comprising another low voltage connection configured to receive a signal corresponding to a current signal present in the separable connector.

10. The sensor according to claim 1, further comprising a memory configured to store at least one of a unique product identifier, data of manufacture, a calibration ratio, a gain value for signal conditioning, and installation data.

11. The sensor according to claim 1, wherein the one or more high voltage capacitors each have a voltage rating of at least about 3 kV.

12. A network comprising the sensor according to claim 1.

13. A shielded termination comprising the sensor according to claim 1.

* * * * *